(12) United States Patent
Lochschmidt

(10) Patent No.: US 6,369,508 B1
(45) Date of Patent: Apr. 9, 2002

(54) MERCURY SHORT-ARC LAMP WITH NIOBIUM GETTER

(75) Inventor: Andreas Lochschmidt, Berlin (DE)

(73) Assignee: Patent-Treuhand-Gesellschaft fuer elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/685,758

(22) Filed: Oct. 9, 2000

(30) Foreign Application Priority Data

Oct. 25, 1999 (DE) .......................... 199 51 445

(51) Int. Cl.⁷ ............................ H01J 19/70; H01J 17/24
(52) U.S. Cl. ........................ 313/558; 313/632
(58) Field of Search ................... 313/631, 632, 313/621, 549, 547, 553, 554, 555, 558

(56) References Cited

U.S. PATENT DOCUMENTS

| | | | |
|---|---|---|---|
| 3,621,322 A | | 11/1971 | Rehmet et al. ............. 313/184 |
| 4,806,828 A | * | 2/1989 | Hurst ....................... 313/558 |
| 4,827,188 A | * | 5/1989 | Hurst ....................... 313/558 |
| 5,712,530 A | * | 1/1998 | Inouet et al. ................ 313/631 |

FOREIGN PATENT DOCUMENTS

EP       0715339       2/1998       ............ H01J/61/26

* cited by examiner

*Primary Examiner*—Michael H. Day
(74) *Attorney, Agent, or Firm*—William H. McNeill

(57) ABSTRACT

The invention proposes arranging a getter (7) made from niobium on the electrode rod (4) of a mercury short-arc lamp, the two following conditions being fulfilled:

$$D > 1.8 \cdot d$$

and $$\alpha \geq 20°.$$

In this case, D and d denote a diameter of the relevant electrode head (2) or the associated electrode rod (4), and α denotes an angle which is defined by the longitudinal axis of the electrode and an imaginary connecting line between the end of the getter (7) averted from the electrode head, and a point on the perpendicular, running through the end of the electrode rod on the electrode head side, to the electrode longitudinal axis. The point mentioned corresponds to the projection of the maximum radius of the lateral surface of the electrode head onto this perpendicular. An improved maintenance of the lamp is thereby achieved.

6 Claims, 3 Drawing Sheets

MERCURY SHORT-ARC LAMP WITH NIOBIUM GETTER

TECHNICAL FIELD

The invention relates to a mercury short-arc lamp in accordance with the preamble of Claim 1.

Such lamps are used, for example, as light source for exposure systems for producing semiconductor components, liquid crystal displays (LCD) or printed circuit boards (PCB). The power consumption of these lamps is typically in the region of approximately 1 kW and 10 kW or more.

Arranged inside the discharge vessel of the lamp are two electrodes situated opposite one another at a slight spacing, typically in the region of between approximately 3 mm and 8 mm. During operation of the lamp, the electrode tips reach temperatures of 2500° C. and above. The discharge vessel surrounds an ionizable gas filling. The main component of this gas filling is mercury. Moreover, the filling can further comprise one or more inert gases, for example xenon, krypton or argon. Gas impurities within the discharge vessel such as oxygen, water vapour and carbon monoxide lead to oxidization and/or carbide formation at the hot electrodes. These oxides or carbides vaporize at the high electrode temperatures and are deposited on the substantially colder discharge vessel wall. This blackening of the vessel wall leads in the final analysis to an unacceptable reduction in the illumination level on the exposure substrates, for example wafers, etc.

PRIOR ART

In order to suppress the gas reactions which act negatively on the light flux and on the maintenance of the lamp, or at least to reduce them conspicuously, it is known to fasten inside the discharge vessel on the electrode lateral surfaces or on the electrode rods a getter which absorbs the gas impurities just described—see, for example, U.S. Pat. No. 3,621,322. Typical getter materials in lamps of the generic type are tantalum (Ta) or zirconium (Zr)—see, for example, EP-A-0 715 339. The getter is fastened around an electrode rod as a metal strip or filament. The tantalum getter reaches temperatures in the region of approximately 1000° C. to 1700° C. and more during operation of the lamp.

However, starting the lamp constitutes a risk to the service life of the getter. It can sometimes occur in this case that the arc attaches itself to the getter before it jumps onto the electrode tips. In this case, the getter becomes instantaneously and at least locally so hot that it fuses and partially vaporizes. There is then an immediate blackening of the lamp bulb, since the vaporized getter material is deposited on the cold lamp bulb. The lamp is thereafter unusable, as a rule. For this reason, tantalum has previously been preferred as getter material, since it has a comparatively very high melting point at 2996° C.

Longer service lives and better maintenance, that is to say as little worsening as possible of the lamp specifications such as light flux, colour rendition etc., during the service life of mercury short-arc lamps are of great importance, particularly concerning the use in exposure machines for IC fabrication, since changing a lamp means a loss of production, and substantial costs are caused thereby.

SUMMARY OF THE INVENTION

It is the object of the present invention to provide a mercury short-arc lamp in accordance with the preamble of Claim 1 having an improved maintenance.

One aspect is to provide a lamp of the generic type which has an improved getter action as regards gas impurities inside the discharge vessel.

This object is achieved in the case of a lamp having the features of the preamble of Claim 1 by the features of the characterizing part of Claim 1. Particularly advantageous refinements are to be found in the dependent claims.

It has emerged that niobium is particularly well suited as getter material under the operating conditions inside the discharge vessel of lamps of the generic type. Approximately double the reactivity of tantalum was found for niobium when oxygen and carbon dioxide were introduced as gases. This was determined by measuring the increase in mass of the respective getters before and after introducing the gas. The reactivity increases similarly to tantalum with rising temperature. However, starting from approximately 1700° C. the vaporization of the niobium oxides produced begins, as a result of which niobium can be used sensibly as getter only below 1700° C.

Another problem is the melting point of the niobium which, at 2468° C., is lower than that of tantalum. Specifically, if the arc attaches itself to the niobium getter during the starting phase, there is an increased risk of local fusing of the niobium associated with a blackening of the wall of the discharge vessel.

The basic idea of the invention is to use niobium as getter material despite these problems, but to arrange the niobium in such a way as to ensure reliable protection against random arc attachment. According to the invention, for this purpose the diameter D of the electrode head is selected to be at least 1.8 times, in particular 2.5 times, better 3 times, as large as the diameter d of the electrode rod, that is to say the lamp according to the invention fulfills the condition $D > 1.8 \cdot d$, in particular $D > 2.5 \cdot d$, better $D > 3 \cdot d$. Moreover, the niobium getter is placed on the electrode rod in such a way that the further condition $\alpha \geq 20°$, better $\alpha \geq 25°$, is likewise fulfilled. Here, $\alpha$ denotes an angle which—viewed in a plane containing the electrode longitudinal axis—is defined by the longitudinal axis of the electrode and an imaginary connecting line. This imaginary connecting line connects the end of the getter averted from the electrode head to a point on the imaginary perpendicular, running through the end of the electrode rod on the electrode head side, to the electrode longitudinal axis. The point mentioned corresponds to the projection of the maximum radius of the lateral surface of the electrode head onto this perpendicular.

What is decisive in these considerations is the overall extent of the getter, in particular the end averted from the electrode head. This end of the getter is naturally at most risk from arc attachment. That is to say, in other words it is ensured in the way according to the invention as explained above that even during the starting phase the entire getter, arranged behind the electrode head, is outside the danger zone as regards an arc attachment. By contrast, the concrete shape of the electrode head plays a subordinate role here, however. Thus, the electrode head can have an essentially circular cylindrical shape, for example, it also being possible for the getter-side edge of the electrode head to be bevelled or rounded. Finally, the electrode head can also have a non-cylindrical shape.

The niobium getter can be physically fitted to the electrode rod in multifarious forms, for example in the form of a foil or a wire filament. The getter need not necessarily be designed with edges or, seen in longitudinal section, with corners or the like for the definition of the imaginary connecting line mentioned above. The connecting line is to be understood in this regard as generalized to the extent that— starting from the point obtained by projecting the maximum radius of the electrode head onto the perpendicular mentioned—it precisely just includes the point on the getter which is furthest removed radially and/or axially with reference to the longitudinal axis. It is ensured in this way that the arc does not attach itself to the getter when the lamp is started. Moreover, it is possible in this way also to make use of relatively extended getters. The minimum angle required according to the invention can be realized specifically, in these cases by virtue of the fact that the ratio of the diameters of the corresponding electrode head and electrode rod is selected to be suitably large. Reference may be made to the exemplary embodiments for further details on this point.

The niobium getter is preferably arranged behind the anode, since in the case of lamps conceived for DC operation, the anode is generally of more massive design than the cathode, as a result of which it is easier to fulfill the above-named conditions for reliable protection against random arc attachment.

Nevertheless, the invention is not restricted to lamps for DC operation. Rather, the invention is also to be understood as generalized to lamps with symmetrical electrodes. To this extent, the use of the terms cathode and anode are to be understood, if appropriate, as referring to the temporary function of both electrodes.

The fastening of the niobium getter can be performed by welding, soldering or mechanical joining, for example latching.

Zirconium (Zr) was initially also considered as getter material. However, it emerged very quickly that all mounting sites considered according to the invention entail an unacceptably high zirconium vapour pressure. Because of the relatively low melting point of zirconium, it is evident that no mounting site with a sufficiently low operating temperature can be found for the getter.

BRIEF DESCRIPTION OF THE DRAWINGS

The aim below is to explain the invention in more detail with the aid of exemplary embodiments. In the drawing.

BEST MODE FOR CARRYING OUT THE INVENTION

Figure 1:
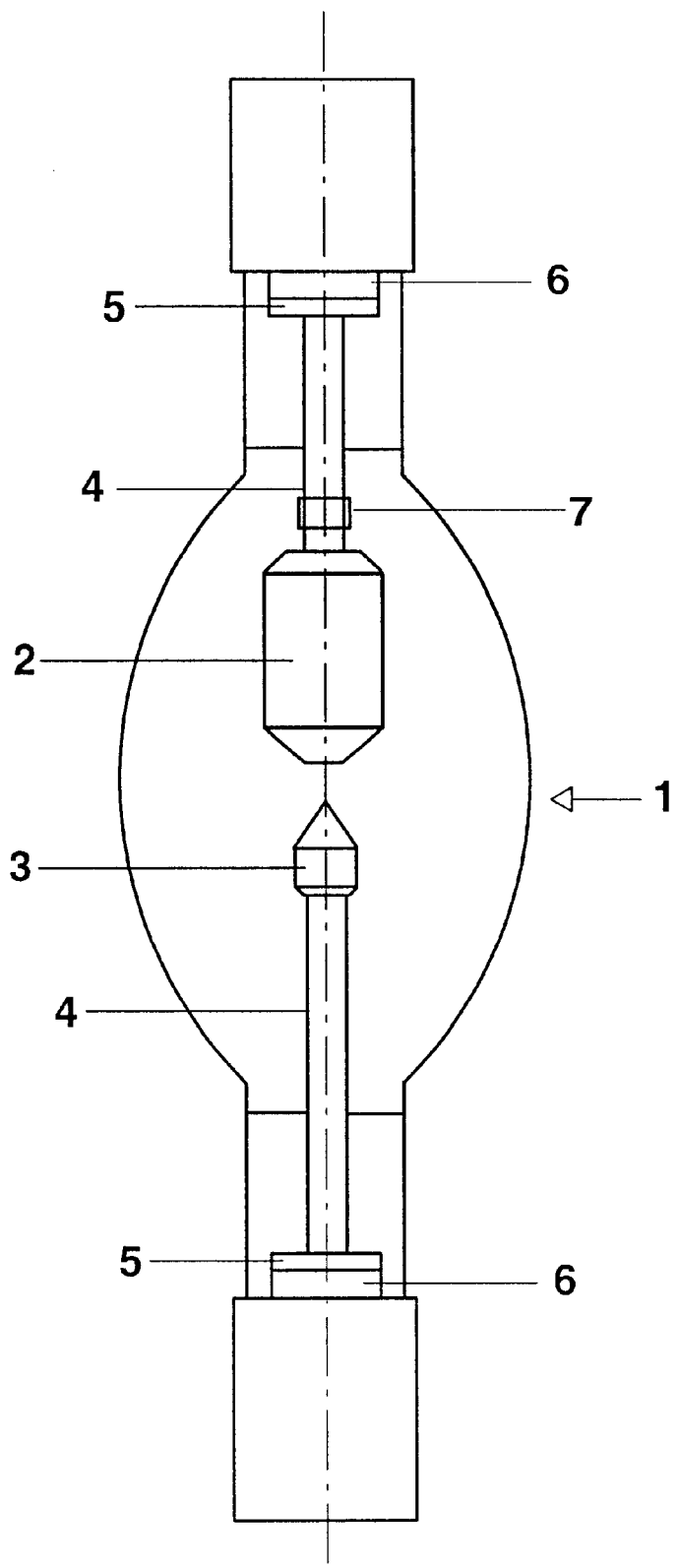
FIG. 1 shows an exemplary embodiment of a lamp according to the invention with a niobium getter in a diagrammatic illustration.

FIG. 1 shows a diagram of a mercury short-arc lamp which is used in the production of semiconductor components, liquid crystal displays or printed circuit boards.

The lamp has an oval discharge vessel 1 made from quartz glass. It encloses a volume of 75 cm$^3$. The interior of the discharge vessel 1 contains 3.8 mg of mercury per cm$^3$ of discharge vessel volume, and xenon at a cold filling pressure of 80 kPa.

An anode 2 and a cathode 3 are arranged inside the discharge vessel 1. The cathode consists of carburized tungsten. The spacing between the electrodes 2, 3 is 4.5 mm. Each electrode 2, 3 is mounted on an electrode rod 4. The electrode rods 4 end in molybdenum plates 5 on which conductive sealing foils 6 are fixed.

A getter 7 is fastened behind the anode 2. Reference is made for further details in this regard to the description relating to FIG. 2 further below.

The lamp is designed for an operating power of 2000 W. The lamp voltage is 24 V, and the lamp current 84 A during operation.

Figure 2:
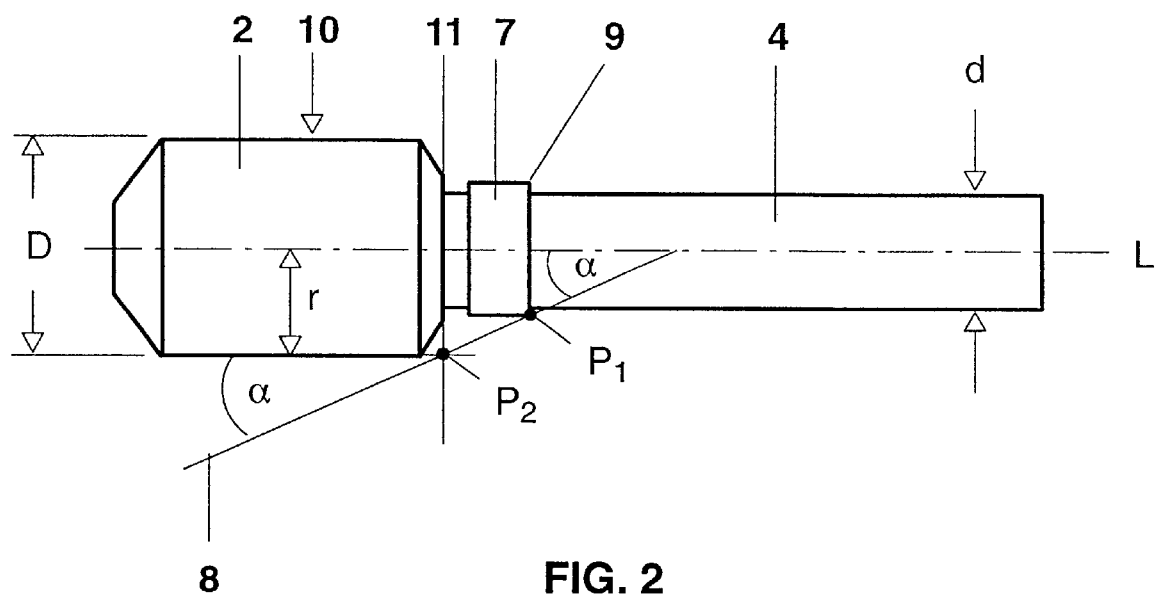
FIG. 2 shows the anode of the lamp in FIG. 1 with a niobium getter in the form of a foil.

FIG. 2 shows the anode of FIG. 1 once again, in detail. The anode head 2 is mounted on the electrode rod 4. Both parts consist of tungsten. The diameter D of the anode is 20 mm, the diameter d of the electrode rod 4 is 6 mm. This results in the quotient of D/d≈3.3. The getter 7 comprises a niobium foil. Also illustrated in the plane of the drawing is the angle α enclosed by an imaginary auxiliary line 8 with the longitudinal axis L of the anode. Viewed in the plane of the drawing, the auxiliary line 8 connects the corner point $P_1$ of the edge 9 of the niobium foil 7 averted from the electrode head 2 to the point $P_2$. The point $P_2$ results from the projection of the radius r of the circular cylindrical lateral surface 10 of the electrode head 2 onto the perpendicular 11, running along the separating line between the electrode rod 4 and the electrode head 2, to the longitudinal axis L. In other words, the point $P_2$ is defined as that point on the perpendicular 11 which, viewed in the plane of the drawing, is at the spacing r from the longitudinal axis L. The angle α is approximately 25°. The niobium getter is thereby reliably protected against random arc attachment during the starting phase, as has been demonstrated by comprehensive investigations of the starting behaviour of this lamp.

Figure 3:
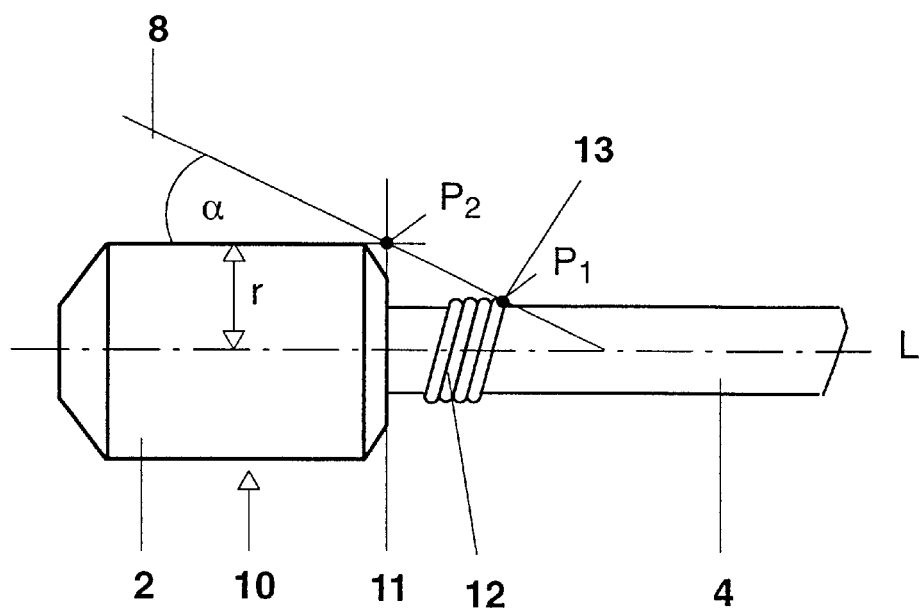
FIG. 3 shows a further exemplary embodiment of an anode with a niobium getter in the form of a filament for a lamp according to the invention.

FIG. 3 shows a diagrammatic illustration of a further exemplary embodiment of an anode. Identical features to FIG. 2 are provided with identical reference symbols. By contrast with FIG. 2, the niobium getter 12 is here wound around the electrode rod in the form of a filament. The imaginary auxiliary line 8 connects the site 13 of the getter filament 12 most remote both radially and axially from the electrode head 2 to the point $P_2$. As in FIG. 2, the point $P_2$ also results here from the projection of the radius r of the circular cylindrical lateral surface 10 of the electrode head 2 onto the perpendicular 11, running along the separating line between the electrode rod 4 and the electrode head 2, to the longitudinal axis L. The angle α is likewise approximately 25° here. Consequently, the niobium getter filament is reliably protected against random arc attachment during the starting phase in this exemplary embodiment, as well.

Figure 4:
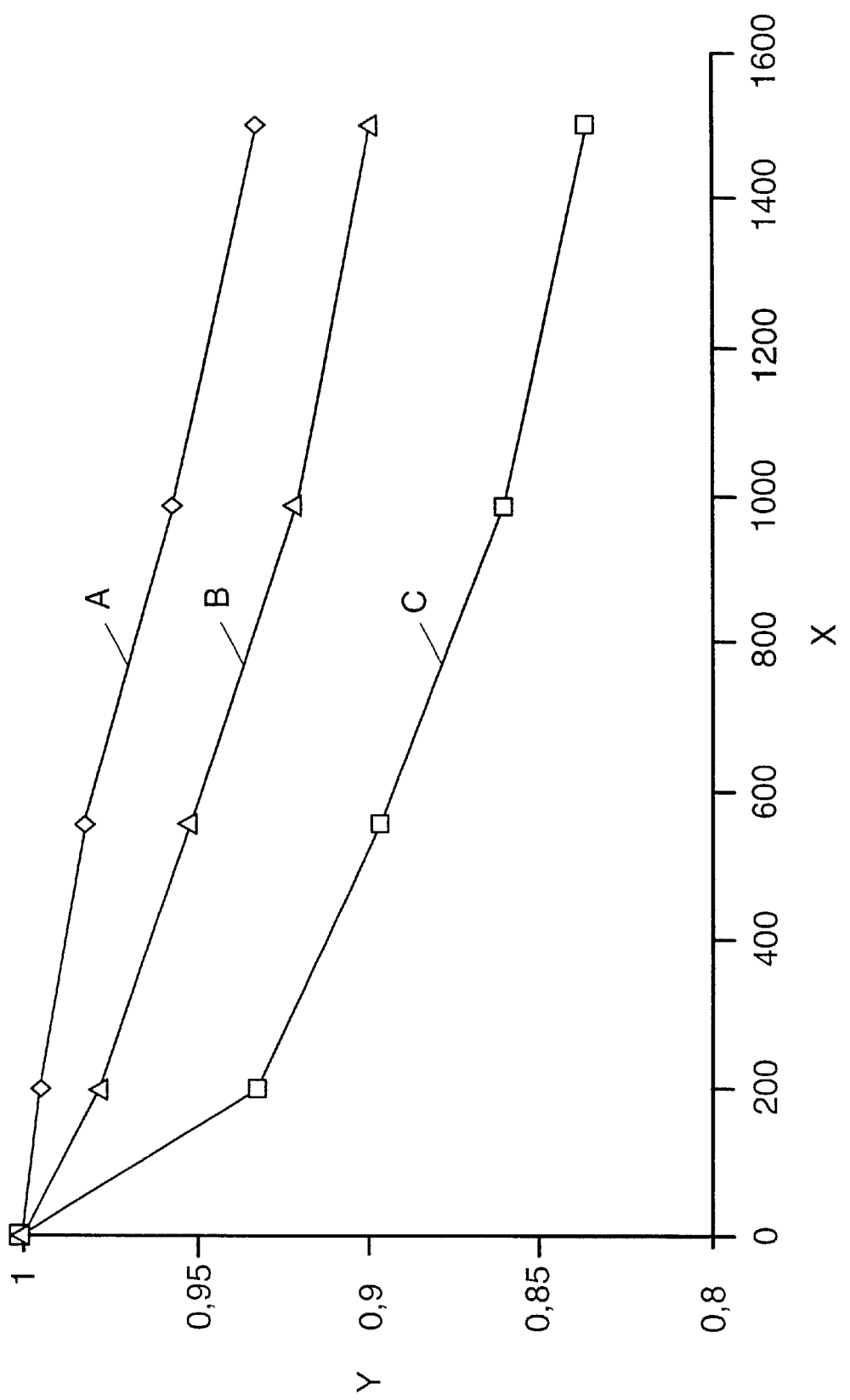
FIG. 4 shows a graph comparing the measured change in the light flux with the burning life for three different lamps.

FIG. 4 shows a graph comparing the maintenance of three different lamps, represented in a cartesian coordinate system. The X-axis specifies the burning life of the respective lamp in hours, and the Y-axis specifies the associated light flux of the lamps, normalized in each case to the value of one. The reference symbols A, B, C mark the measured values of the lamp according to the invention from FIG. 1, that is to say with a niobium getter, or the same lamp as in the case of A, but with tantalum as getter material, or the lamp in A without getter. The lamp with niobium getter (curve A) exhibits a lower drop in the light flux during the entire service life than the lamp with the same quantity of tantalum getter (curve B). Consequently, the getter action of the niobium, which is better in principle, can also actually be realized in the lamp according to the invention without fusing of the niobium getter owing to undesired arc attachments to the getter during the starting phase once again nullifying this advantage. It was also possible for this result to be confirmed by optical investigations during the starting phases. As expected, the lamp without getter exhibits the poorest maintenance (curve C).

Although the invention has been explained in the exemplary embodiments with the aid of a cylindrical electrode head, the invention is not to be understood as limited to this shape of the electrode head.

What is claimed is:

1. Mercury short-arc lamp having
    a discharge vessel (1) which surrounds an ionizable filling,
    two electrodes which are arranged opposite one another inside the discharge vessel (1), each electrode comprising an electrode head (2, 3) and an electrode rod (4) defining a longitudinal axis (L), which electrode rod (4) supports the electrode head (2, 3),
    a getter (7; 12) which is arranged on an electrode rod (4), characterized in that the getter (7; 13) consists of niobium, and the two following conditions are fulfilled:

$$D > 1.8 \cdot d$$

and $$\alpha \geq 20°,$$

D and d respectively denoting a diameter of the relevant electrode head (2) and the associated electrode rod (4), and α denoting an angle which—viewed in a plane containing the electrode longitudinal axis (L)—is defined by the electrode longitudinal axis (L), on the one hand, and an imaginary connecting line (8), on the other hand, the connecting line (8) connecting a point ($P_2$) on an imaginary perpendicular (11), running through the end of the electrode rod on the electrode head side, to the end ($P_1$) of the getter (7; 12) averted from the electrode head, and the point ($P_2$) corresponding to a projection of the maximum radius (r) of the lateral surface (11) of the electrode head (2) onto this perpendicular (11).

2. Lamp according to claim 1, in which the condition $\alpha \geq 25°$ is fulfilled for the angle α.

3. Lamp according to claim 1 in which the condition $D \geq 2.5 \cdot d$ is fulfilled for the diameters D and d.

4. Lamp according to claim 2 in which the condition $D \geq 2.5 \cdot d$ is fulfilled for the diameters D and d.

5. Lamp according to claim 3, in which the condition $D \geq 3.0 \cdot d$ is fulfilled for the diameters D and d.

6. Lamp according to claim 4, in which the condition $D \geq 3.0 \cdot d$ is fulfilled for the diameters D and d.

* * * * *